United States Patent
Otsubo et al.

(10) Patent No.: US 10,643,922 B2
(45) Date of Patent: May 5, 2020

(54) SEMICONDUCTOR DEVICE

(71) Applicant: Mitsubishi Electric Corporation, Tokyo (JP)

(72) Inventors: Yoshitaka Otsubo, Tokyo (JP); Yoshitaka Kimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/115,463

(22) Filed: Aug. 28, 2018

(65) Prior Publication Data
US 2019/0157182 A1 May 23, 2019

(30) Foreign Application Priority Data

Nov. 17, 2017 (JP) ................. 2017-221442

(51) Int. Cl.
| | |
|---|---|
| *H01L 23/373* | (2006.01) |
| *H01L 23/492* | (2006.01) |
| *H01L 23/04* | (2006.01) |
| *H01L 23/24* | (2006.01) |
| *H01L 23/10* | (2006.01) |
| H01L 23/495 | (2006.01) |

(52) U.S. Cl.
CPC .......... *H01L 23/3736* (2013.01); *H01L 23/04* (2013.01); *H01L 23/10* (2013.01); *H01L 23/24* (2013.01); *H01L 23/3735* (2013.01); *H01L 23/4926* (2013.01); *H01L 23/49568* (2013.01); *H01L 2224/48091* (2013.01); *H01L 2224/73265* (2013.01); *H01L 2924/19107* (2013.01)

(58) Field of Classification Search
None
See application file for complete search history.

(56) References Cited

U.S. PATENT DOCUMENTS

2016/0071778 A1\* 3/2016 Otsubo ................... H01L 24/32
257/687

FOREIGN PATENT DOCUMENTS

| JP | 04199548 A | * | 7/1992 |
|---|---|---|---|
| JP | 2010-034346 A | | 2/2010 |
| JP | 2016-058563 A | | 4/2016 |

OTHER PUBLICATIONS

An Office Action mailed by the German Patent and Trademark Office dated Dec. 19, 2019, which corresponds to German Patent Application No. 10 2018 217 420.2 and is related to U.S. Appl. No. 16/115,463.

\* cited by examiner

*Primary Examiner* — Robert K Carpenter
(74) *Attorney, Agent, or Firm* — Studebaker & Brackett PC

(57) ABSTRACT

A base plate includes a heat dissipation metal plate and a resin insulating layer. The resin insulating layer is formed on the heat dissipation metal plate. The resin insulating layer is provided with a notch where part of the heat dissipation metal plate is exposed. A case is bonded to an exposure part being part of the heat dissipation metal plate by means of a bonding agent.

10 Claims, 8 Drawing Sheets

F I G. 3
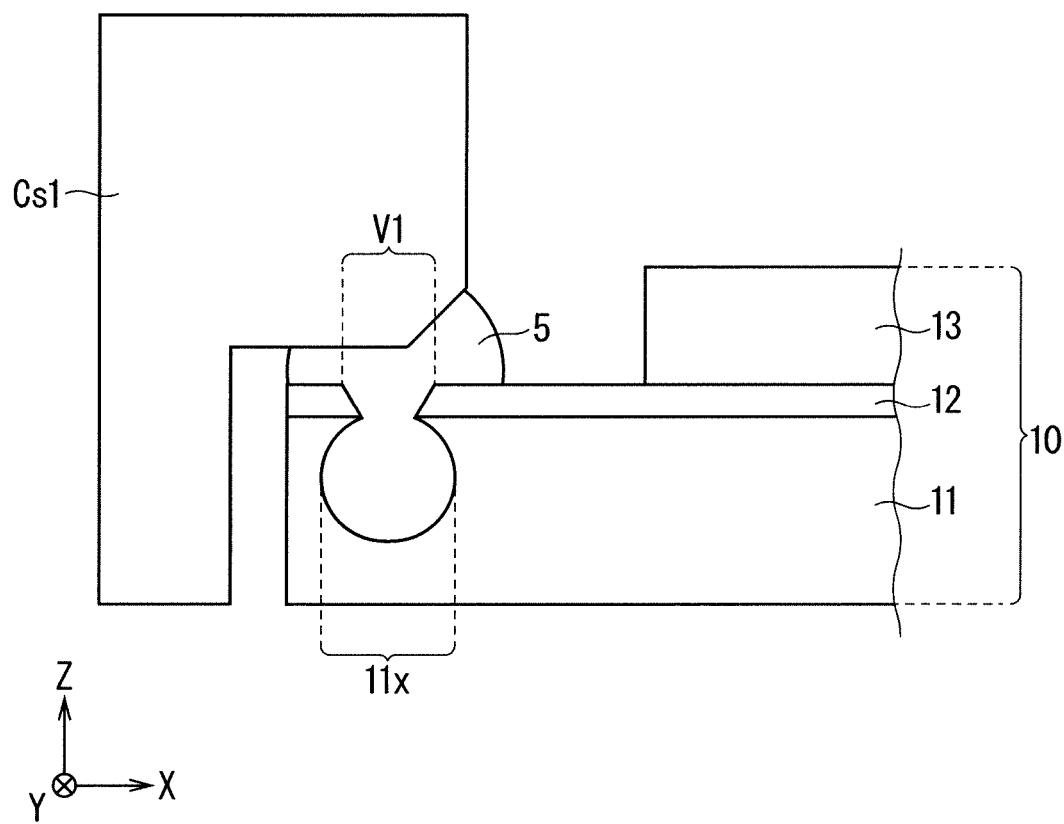

SEMICONDUCTOR DEVICE

BACKGROUND OF THE INVENTION

Field of the Invention

The present invention relates to a semiconductor device including a base plate bonded to a case.

Description of the Background Art

In an attempt to improve the productivity and reliability of power modules, the direct potting sealing technique is becoming widespread. The direct potting sealing technique is a technique of injecting sealing resin into a case. The sealing resin is, for example, epoxy resin in which filler is dispersed.

Japanese Patent Application Laid-Open No. 2016-058563 discloses the structure using the above-described sealing technique (hereinafter also referred to as the "related structure A"). Specifically, the related structure A discloses the structure for stably forming convex warp with an insulating substrate.

In the semiconductor device using the sealing technique, even in high-temperature environments, a case needs to be tightly fixed to a base plate. The base plate includes a metal plate. Further, on the metal plate, an insulating layer structured by resin is formed. In order for the case to be tightly fixed to the base plate, the case needs to be bonded to the metal plate of the base plate by means of a bonding agent. The related structure A does not satisfy this requirement.

SUMMARY

An object of the present invention is to provide a semiconductor device in which a case is bonded to a metal plate of a base plate by means of a bonding agent.

A semiconductor device according to an aspect of the present invention includes a base plate bonded to a case by means of a bonding agent. The base plate includes a heat dissipation metal plate having a heat dissipation property, and a resin insulating layer structured by resin. The resin insulating layer is formed on the heat dissipation metal plate. The resin insulating layer is provided with a notch where part of the heat dissipation metal plate is exposed. The case is bonded, by means of the bonding agent, to an exposure part being part of the heat dissipation metal plate and exposed by the notch.

According to the present invention, the base plate includes the heat dissipation metal plate and the resin insulating layer. The resin insulating layer is formed on the heat dissipation metal plate. The resin insulating layer is provided with the notch where part of the heat dissipation metal plate is exposed. The case is bonded, by means of the bonding agent, to an exposure part being part of the heat dissipation metal plate. Thus, the semiconductor device in which the case is bonded to the metal plate of the base plate by means of the bonding agent is provided.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is an illustration for describing the structure according to Variation 1;

DESCRIPTION OF THE PREFERRED EMBODIMENT

Figure 1:
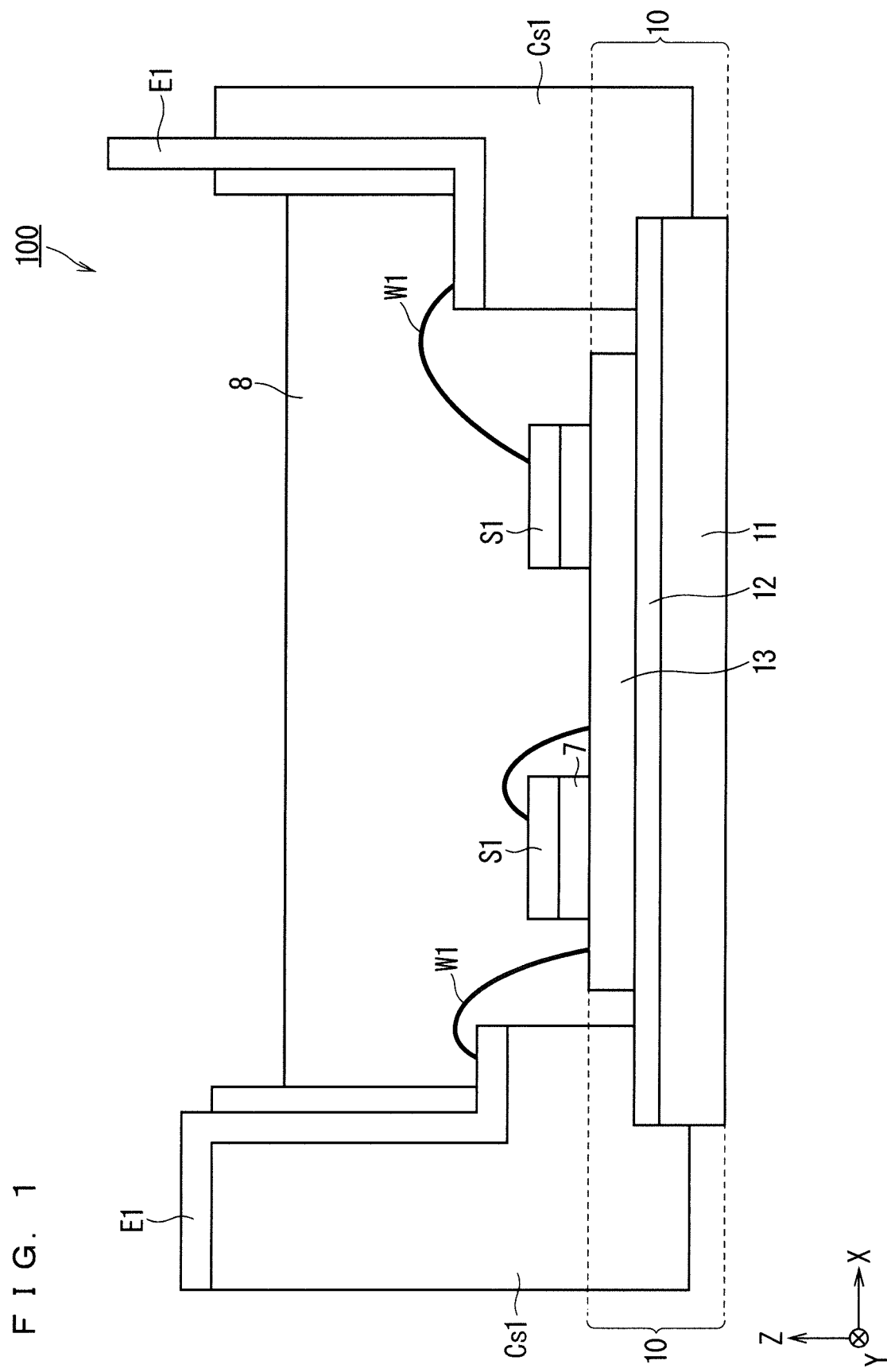
FIG. 1 is a cross-sectional view of a semiconductor device according to a first preferred embodiment of the present invention.

In the following, with reference to the drawings, a description will be given of a preferred embodiment of the present invention. In the drawings referred to in the following, an identical constituent component is denoted by an identical reference character. Those constituent components denoted by an identical reference character are the same in name and function. Accordingly, a detailed description may be omitted as to part of such constituent components denoted by an identical reference character.

Note that, the dimension, material, and shape of each of the constituent components exemplarily shown in the preferred embodiment and the relative disposition of the constituent components may be changed as appropriate depending on the structure, various conditions and the like of the device to which the present invention is applied. Further, the dimension of each of the constituent components in the drawings may differ from the actual dimension.

First Preferred Embodiment

FIG. 1 is a cross-sectional view of a semiconductor device 100 according to a first preferred embodiment of the present invention. The semiconductor device 100 is used for various purposes such as power generation and delivery, efficient use and renewal of energy and the like.

In FIG. 1, an X direction, a Y direction, and a Z direction are perpendicular to each other. In the subsequent drawings also, the X direction, the Y direction, and the Z direction are perpendicular to each other. Hereinafter, a direction including the X direction and a direction opposite to the X direction (−X direction) is also referred to as the "X-axis direction". Further, hereinafter, a direction including the Y direction and a direction opposite to the Y direction (−Y direction) is also referred to as the "Y-axis direction". Still further, hereinafter, a direction including the Z direction and a direction opposite to the Z direction (−Z direction) is also referred to as the "Z-axis direction".

Further, hereinafter, a plane including the X-axis direction and the Y-axis direction is also referred to as the "XY plane". Further, hereinafter, a plane including the X-axis direction and the Z-axis direction is also referred to as the "XZ plane". Still further, hereinafter, a plane including the Y-axis direction and the Z-axis direction is also referred to as the "YZ plane".

With reference to FIG. 1, the semiconductor device 100 includes a base plate 10, a case Cs1, and a plurality of semiconductor elements S1.

The shape of the base plate 10 as seen in a plan view (the XY plane) is quadrangular. The base plate 10 includes a heat dissipation metal plate 11, a resin insulating layer 12, and a metal circuit board 13. The heat dissipation metal plate 11 is a metal plate having the heat dissipation property. The shape of the heat dissipation metal plate 11 as seen in a plan view (the XY plane) is quadrangular. The heat dissipation metal plate 11 is structured by a material exhibiting high thermal conductivity. Specifically, the heat dissipation metal plate 11 is structured by any of aluminum, silver, and copper. Note that, the heat dissipation metal plate 11 may be structured by alloy. Specifically, the heat dissipation metal plate 11 may be structured by an alloy composed of at least two materials out of aluminum, silver, and copper. The heat dissipation metal plate 11 may be structured by, for example, an alloy of aluminum and silver.

The resin insulating layer 12 has the insulating property. The resin insulating layer 12 is structured by resin. The resin insulating layer 12 is formed on the heat dissipation metal plate 11.

The metal circuit board 13 is formed on the resin insulating layer 12. Note that, the metal circuit board 13 is formed at the central part of the resin insulating layer 12 as seen in a plan view (the XY plane). That is, as seen in a plan view (the XY plane), the metal circuit board 13 does not exist above the rim part of the resin insulating layer 12.

The metal circuit board 13 is structured by any of aluminum, silver, and copper. Note that, the metal circuit board 13 may be structured by alloy. Specifically, the metal circuit board 13 may be structured by an alloy composed of at least two materials out of aluminum, silver, and copper.

Note that, FIG. 1 schematically shows the structure of the metal circuit board 13. Specifically, FIG. 1 shows the metal circuit board 13 not being etched. Actually, on the resin insulating layer 12, the metal circuit board 13 provided with a circuit pattern by etching exists.

The base plate 10 is provided with a plurality of semiconductor elements S1 as semiconductor chips each by means of a bonding agent 7. Note that, while FIG. 1 shows two semiconductor elements S1, the number of the semiconductor elements S1 provided on the base plate 10 is not limited to two, and may be one or three or more.

The semiconductor elements S1 are each formed by using a wide-bandgap material. The wide-bandgap material is, for example, SiC, GaN or the like. The semiconductor elements S1 are each a power semiconductor element such as a GTO (Gate Turn Off Thyristor), or an IGBT (Insulated Gate Bipolar Transistor).

The shape of the case Cs1 is, for example, tubular. The shape of the case Cs1 as seen in a plan view (the XY plane) is closed loop-like. The case Cs1 is structured by, for example, resin.

Figure 2:
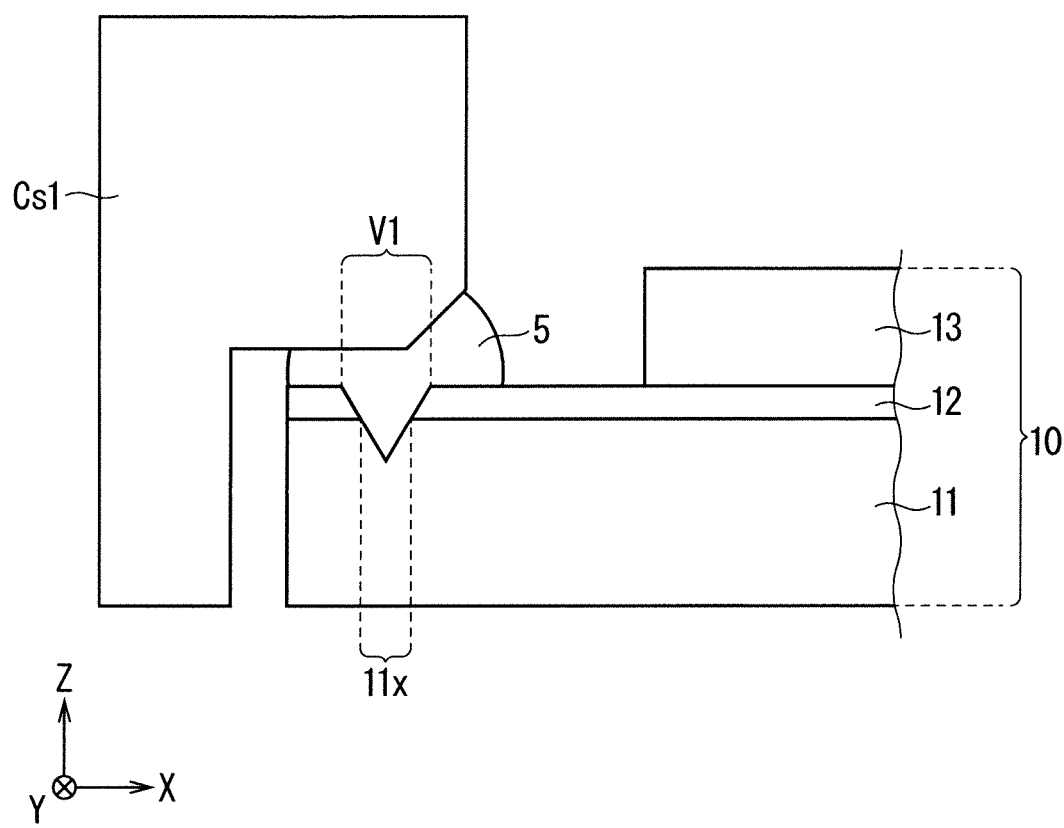
FIG. 2 is an enlarged view mainly showing a bonding structure of a case and a base plate according to the first preferred embodiment.

Note that, FIG. 1 schematically shows the bonding structure of the case Cs1 and the base plate 10. Accordingly, FIG. 1 does not show a bonding agent 5 and a notch V1 each of which will be described later. FIG. 2 is an enlarged view mainly showing the bonding structure of the case Cs1 and the base plate 10 according to the first preferred embodiment.

With reference to FIGS. 1 and 2, the base plate 10 is bonded to the case Cs1 by means of the bonding agent 5. The case Cs1 bonded to the base plate 10 surrounds the semiconductor elements S1, the metal circuit board 13 and the like. Further, the case Cs1 has its inside filled with a sealing resin 8. The sealing resin 8 is, for example, epoxy resin. Further, the case Cs1 is provided with terminal electrodes E1. The terminal electrodes E1 are electrically connected to the semiconductor elements S1 via wires W1, respectively.

The resin insulating layer 12 is provided with the notch V1 where part of the heat dissipation metal plate 11 is exposed outside the base plate 10 (the resin insulating layer 12). In the following, the part of the heat dissipation metal plate 11 exposed outside the base plate 10 (the resin insulating layer 12) by the notch V1 is also referred to as the "exposure part 11x". The exposure part 11x according to the first preferred embodiment is a groove.

As shown in FIG. 2, the case Cs1 is bonded to the exposure part 11x by means of the bonding agent 5. The bonding agent 5 is adhesive. The bonding agent 5 is structured by a material for securing the tolerance for stress. The bonding agent 5 is structured by, for example, an epoxy-based material. The exposure part 11x has its inside filled with part of the bonding agent 5.

As has been described above, according to the first preferred embodiment, the base plate 10 includes the heat dissipation metal plate 11, and the resin insulating layer 12. The resin insulating layer 12 is formed on the heat dissipation metal plate 11. The resin insulating layer 12 is provided with the notch V1 where part of the heat dissipation metal plate 11 is exposed. The case Cs1 is bonded to the exposure part 11x, which is part of the heat dissipation metal plate 11, by means of the bonding agent 5.

Thus, the semiconductor device in which the case is bonded to the metal plate of the base plate by means of the bonding agent is provided.

Further, according to the first preferred embodiment, part of the heat dissipation metal plate 11 is exposed outside the base plate 10. Accordingly, use of the bonding agent 5 can improve adhesion between the base plate 10 (part of the heat dissipation metal plate 11) and the case Cs1. Thus, high reliability can be secured.

Further, the heat dissipation metal plate 11 is structured by any of aluminum, silver, and copper. Note that, the heat dissipation metal plate 11 may be structured by an alloy composed of at least two materials out of aluminum, silver, and copper.

Still further, the metal circuit board 13 is structured by any of aluminum, silver, and copper. Note that, the metal circuit board 13 may be structured by an alloy composed of at least two materials out of aluminum, silver, and copper.

As has been described above, each of the heat dissipation metal plate 11 and the metal circuit board 13 is structured by a metal material exhibiting high thermal conductivity. This structure can further reduce thermal resistance of each of the heat dissipation metal plate 11 and the metal circuit board 13.

Further, the semiconductor elements S1 are each formed using a wide-bandgap material. Thus, also in the case where the semiconductor elements S1 are each used as a high-speed switching element, the reliability of the semiconductor device 100 can be secured. Further, the semiconductor device 100 having the semiconductor elements S1 has the cooling structure addressing to high-temperature environments.

Figure 8:
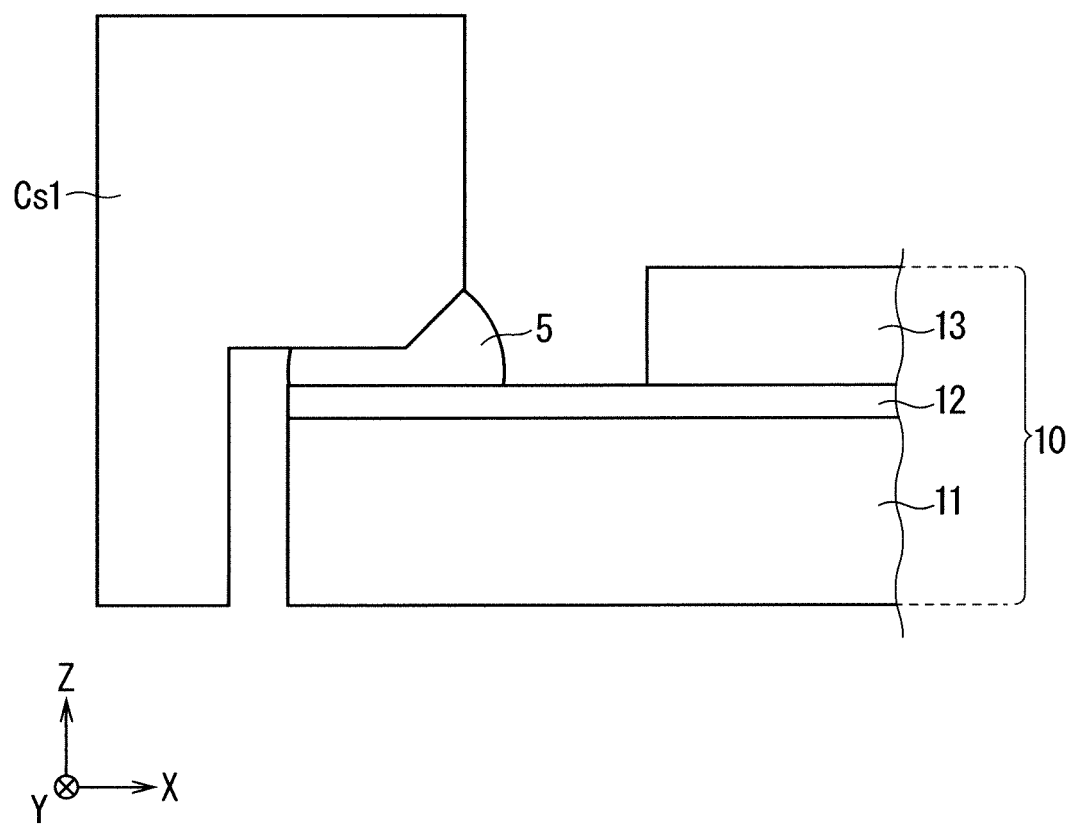
FIG. 8 is an enlarged view showing the bonding structure of a case and a base plate according to Comparative Example.

Here, a description will be given of Comparative Example against which the first preferred embodiment is compared. FIG. 8 is an enlarged view showing the bonding structure of the case Cs1 and the base plate 10 according to Comparative Example.

In the Comparative Example, the case Cs1 is bonded to the resin insulating layer 12 of the base plate 10 by means of the bonding agent 5. In high-temperature environments, the bonding strength between the resin insulating layer 12 and the heat dissipation metal plate 11 reduces. Therefore, the structure according to the Comparative Example has a problem that the case Cs1 is not tightly fixed to the base plate in high-temperature environments.

Addressing thereto, the semiconductor device 100 according to the first preferred embodiment has the above-described structure. Accordingly, the semiconductor device 100 according to the first preferred embodiment can solve the problem of the Comparative Example.

Note that, in the field of semiconductors, in addition to ever-denser integration and ever-faster speed demanded of the LSIs (Large Scale Integrations), power devices such as GTOs and IGBTs are finding widespread application. Accordingly, the amount of heat generated by silicon chips has been increasing.

Then, semiconductor devices are employed in the fields where long-term reliability is required, such as electric rail cars and electric vehicles. Under the circumstances, what are becoming critical are measures against a further increase in temperature of a circuit board equipped with a silicon chip, and a semiconductor device equipped with the circuit board.

Note that, the conventional semiconductor device using the sealing technique tends to invite excessive stress at the bonding part between the base plate and the case in high-temperature environments. Therefore, with the conventional semiconductor device, the material used for the bonding part between the base plate and the case needs to be changed, that is, the number of the processes increases. Such an increase disadvantageously prevents a cost-efficient improvement in reliability of the bonding part between the base plate and the case.

Therefore, the reliability of the bonding part between the base plate and the case needs to be improved. Note that, the semiconductor device 100 according to the first preferred embodiment has the above-described structure. Therefore, the first preferred embodiment does not necessitate changing the material and the like. That is, the first preferred embodiment is capable of improving adhesion between the base plate 10 (part of the heat dissipation metal plate 11) and the case Cs1 with simple processes.

<Variation 1>

Hereinafter, the structure of the first preferred embodiment is also referred to as the "structure Ct1". Further, hereinafter, the structure of Variation 1 is also referred to as the "structure Ctm1". The structure Ctm1 is characterized in the shape of the exposure part 11x. The structure Ctm1 is applied to the structure Ct1 (the first preferred embodiment).

FIG. 3 is an illustration for describing the structure Ctm1 according to Variation 1. With reference to FIG. 3, the cross-sectional shape of the exposure part 11x (the groove) is circular. In the structure Ctm1, the exposure part 11x has its inside filled with the bonding agent 5.

As has been described above, according to Variation 1, the cross-sectional shape of the exposure part 11x (the groove) is circular. Further, the exposure part 11x has its inside filled with the bonding agent 5. This structure can improve the anchoring effect. Consequently, adhesion between the base plate 10 (part of the heat dissipation metal plate 11) and the case Cs1 can be further improved. Further, the exposure part 11x (the groove) in the structure Ctm1 can be formed in the process of etching the metal circuit board. That is, it is not necessary to separately provide a process of forming the exposure part 11x (the groove) and, therefore, the exposure part 11x can be formed cost-efficiently.

<Variation 2>

Hereinafter, the structure of Variation 2 is also referred to as the "structure Ctm2". The structure Ctm2 is characterized in the position where the exposure part 11x is provided. The structure Ctm2 is applied to the structure Ct1 (the first preferred embodiment).

Figure 4:
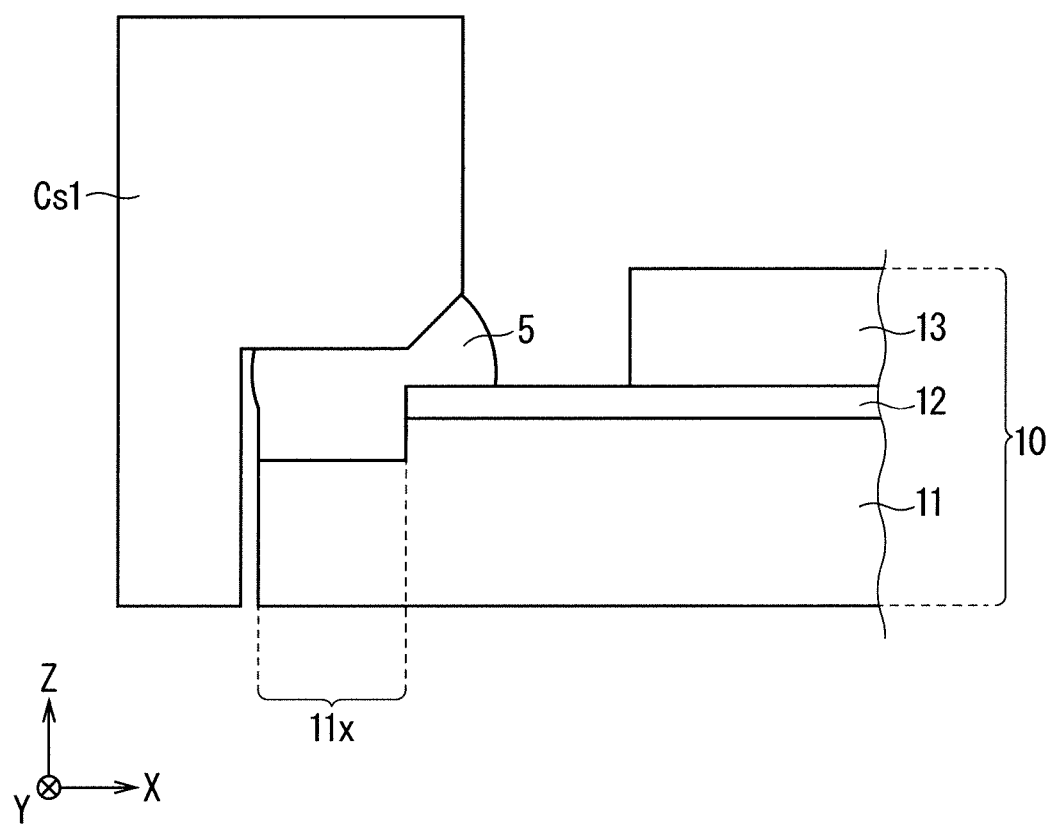
FIG. 4 is an illustration for describing the structure according to Variation 2.
Figure 5:
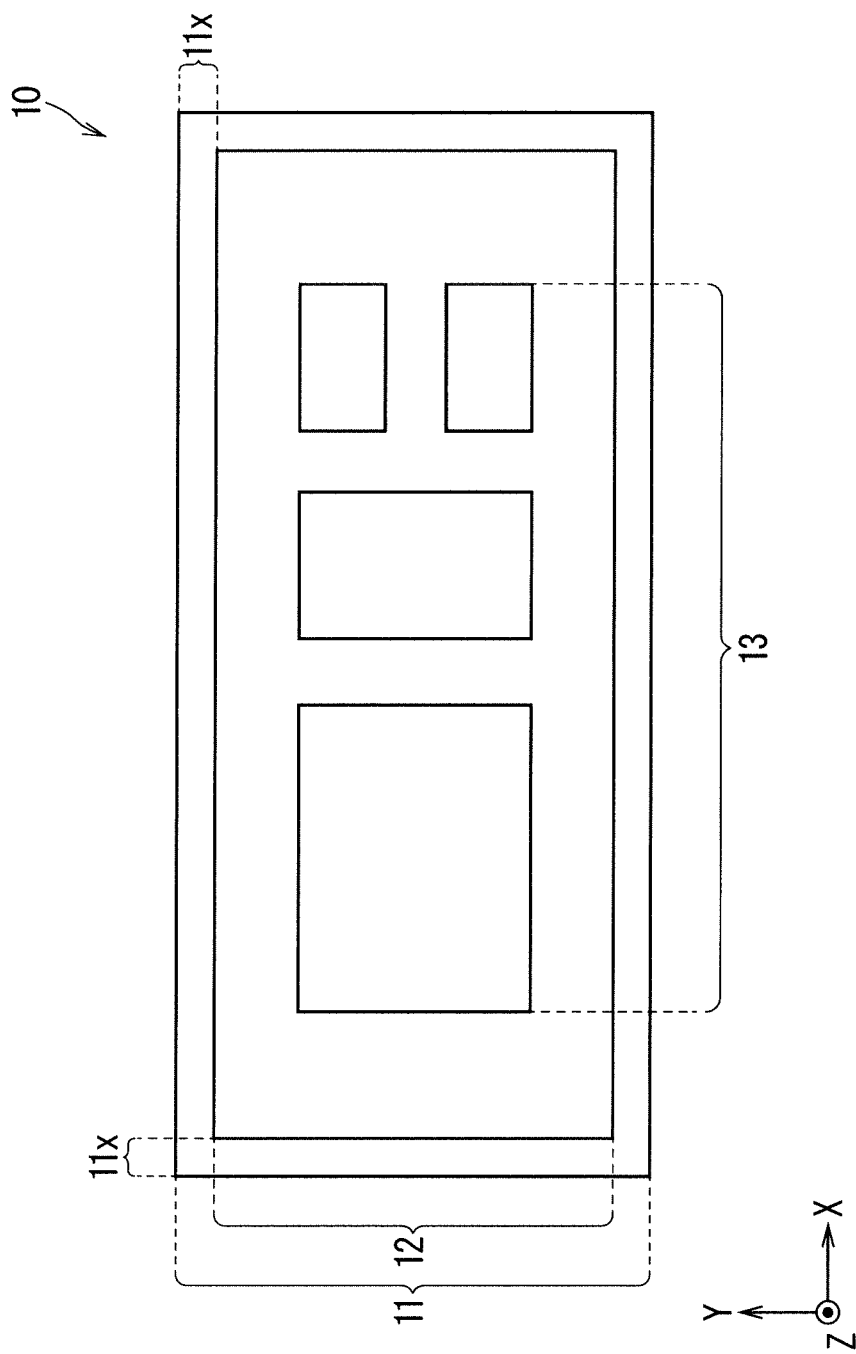
FIG. 5 is a plan view of a base plate to which the structure according to Variation 2 is applied.

FIG. 4 is an illustration for describing the structure Ctm2 according to Variation 2. FIG. 5 is a plan view of the base plate 10 to which the structure Ctm2 according to Variation 2 is applied. With reference to FIGS. 4 and 5, in the structure Ctm2, the exposure part 11x exists at the rim part of the heat dissipation metal plate 11 (the base plate 10). Specifically, as seen in a plan view (the XY plane), the exposure part 11x exists over the entire rim part of the heat dissipation metal plate 11 (the base plate 10).

As has been described above, according to Variation 2, the exposed area of the heat dissipation metal plate 11 is great. Accordingly, adhesion between the base plate 10 (part of the heat dissipation metal plate 11) and the case Cs1 can be further improved.

<Variation 3>

Hereinafter, the structure of Variation 3 is also referred to as the "structure Ctm3". The structure Ctm3 is a structure characterized in the position where the exposure part 11x is provided. The structure Ctm3 is applied to all or part of the structure Ct1 (the first preferred embodiment) and the structure Ctm1 (Variation 1).

Figure 6:
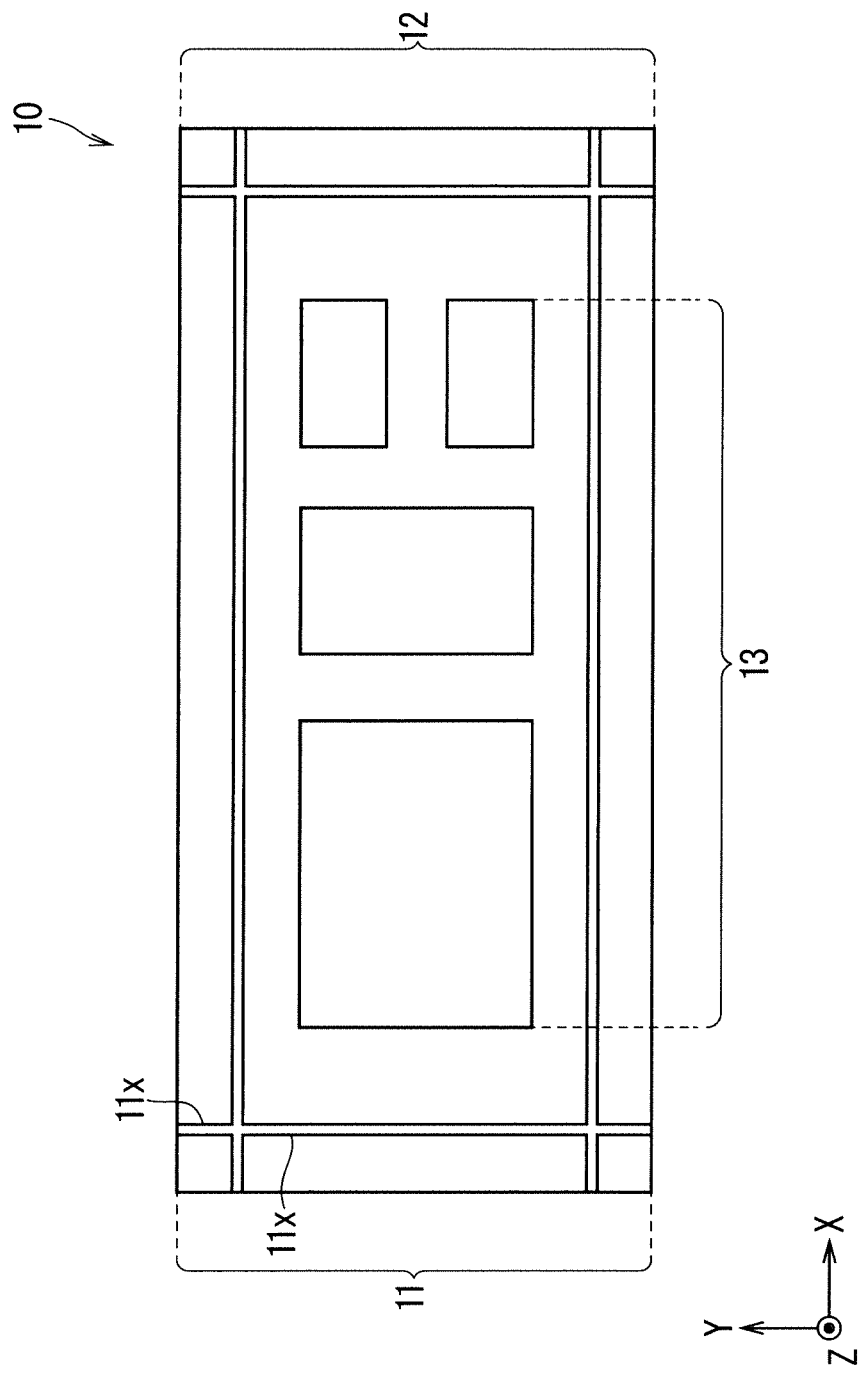
FIG. 6 is an illustration for describing the structure according to Variation 3.

FIG. 6 is an illustration for describing the structure Ctm3 according to Variation 3. With reference to FIG. 6, in the structure Ctm3, the exposure parts 11x exist over the four corners of the heat dissipation metal plate 11.

Specifically, in the structure Ctm3, the heat dissipation metal plate 11 has four exposure parts 11x. The four exposure parts 11x exist at the rim part of the heat dissipation metal plate 11. The four exposure parts 11x include two exposure parts 11x extending in the X-axis direction and two exposure parts 11x extending in the Y-axis direction. Each of the exposure parts 11x extending in the X-axis direction and each of the exposure parts 11x extending in the Y-axis direction cross each other at any one of the four corners of the heat dissipation metal plate 11.

As has been described above, according to Variation 3, the manufacturing costs can be reduced while securing the adhesion of the whole rim part of the base plate 10.

<Variation 4>

Hereinafter, the structure of Variation 4 is also referred to as the "structure Ctm4". The structure Ctm4 is a structure in which the heat dissipation metal plate 11 includes a plurality of exposure parts. The structure Ctm4 is applied to all or part of the structure Ct1, the structure Ctm1, and the structure Ctm2.

As an example, the structure Ct1 to which the structure Ctm4 is applied (hereinafter also referred to as the "structure Ct1m4") is shown in the following. The structure Ct1m4 is a structure obtained by applying the structure Ctm4 to the structure shown in FIG. 2.

Figure 7:
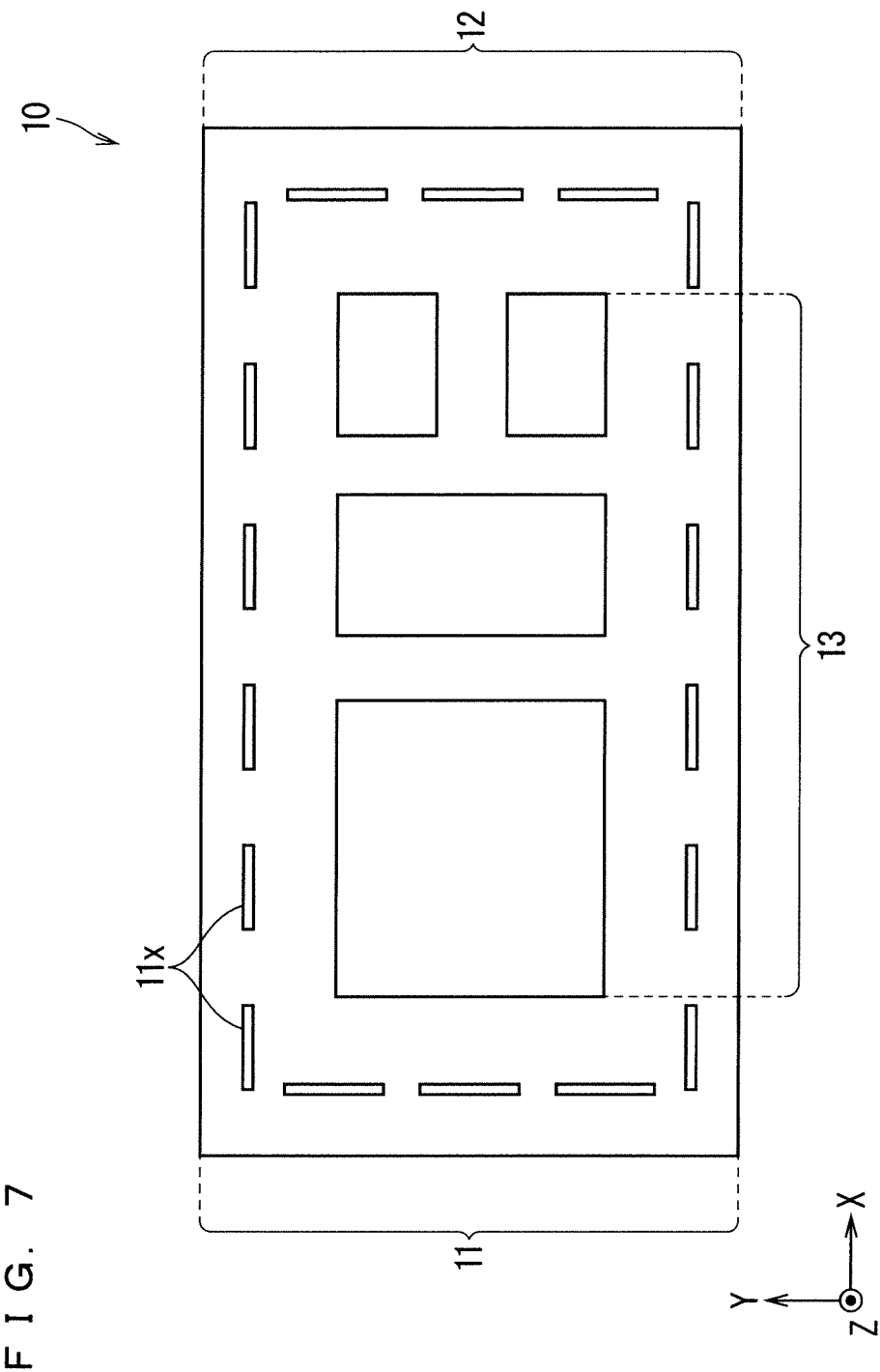
FIG. 7 is an illustration for describing the structure according to Variation 4.

FIG. 7 is an illustration for describing the structure Ct1m4 according to Variation 4. With reference to FIG. 7, in the structure Ct1m4, the heat dissipation metal plate 11 has a plurality of exposure parts 11x. The plurality of exposure parts 11x exist at the rim part of the heat dissipation metal plate 11 (the base plate 10). As seen in a plan view (the XY plane), the plurality of exposure parts 11x are spaced apart from each other. Further, as seen in a plan view (the XY plane), a plurality of exposure parts 11x are provided in a quadrangular shape.

The plurality of exposure parts 11x are respectively provided just at portions where adhesion between the base plate 10 and the case Cs1 is required. This structure makes it possible to secure a greatest possible mounting area of the chip.

Note that, the structure Ctm1 to which the structure Ctm4 is applied (hereinafter also referred to as the "structure Ctm14") has the following structure. In the structure Ctm14, the cross-sectional shape of each of the exposure parts 11x (grooves) shown in FIG. 7 is circular as shown in FIG. 3.

Note that, as to the present invention, the preferred embodiment and Variations can be freely combined, modified, or omitted as appropriate without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
a base plate bonded to a case by means of a bonding agent, wherein
the base plate includes a heat dissipation metal plate having a heat dissipation property, and a resin insulating layer structured by resin,
the resin insulating layer is formed on the heat dissipation metal plate,
the resin insulating layer is provided with a notch where part of the heat dissipation metal plate is exposed,
the case is bonded, by means of the bonding agent, to an exposure part being a groove existing in the heat dissipation metal plate and exposed by the notch, and
the bonding agent directly contacts with the case and an inner surface of the groove existing in the heat dissipation metal plate.

2. The semiconductor device according to claim 1, wherein
a cross-sectional shape of the groove is circular.

3. The semiconductor device according to claim 1, wherein the exposure part exists at a rim part of the heat dissipation metal plate.

4. The semiconductor device according to claim 1, wherein the exposure part exists over four corners of the heat dissipation metal plate.

5. The semiconductor device according to claim 1, wherein
the heat dissipation metal plate has a plurality of the exposure parts, and
the plurality of exposure parts are spaced apart from each other.

6. The semiconductor device according to claim 1, wherein the heat dissipation metal plate is structured by any of aluminum, silver, and copper.

7. The semiconductor device according to claim 1, wherein the heat dissipation metal plate is structured by alloy composed of at least two materials out of aluminum, silver, and copper.

8. The semiconductor device according to claim 1, wherein
a metal circuit board is formed on the resin insulating layer, and
the metal circuit board is structured by any of aluminum, silver, and copper.

9. The semiconductor device according to claim 1, wherein
a metal circuit board is formed on the resin insulating layer, and
the metal circuit board is structured by an alloy composed of at least two materials out of aluminum, silver, and copper.

10. The semiconductor device according to claim 1, wherein
the base plate is provided with a semiconductor element, and
the semiconductor element is formed by using a wide-bandgap material.

* * * * *